(12) United States Patent
Nienhuys et al.

(10) Patent No.: US 8,797,504 B2
(45) Date of Patent: *Aug. 5, 2014

(54) LITHOGRAPHIC APPARATUS AND DEVICE MANUFACTURING METHOD

(75) Inventors: Han-Kwang Nienhuys, Utrecht (NL); Martinus Agnes Willem Cuijpers, Veldhoven (NL); Leon Martin Levasier, Hedel (NL); Jan Bernard Plechelmus Van Schoot, Eindhoven (NL); Yuri Johannes Gabriël Van De Vijver, Best (NL); Oleg Viacheslavovich Voznyi, Eindhoven (NL); Franciscus Johannes Joseph Janssen, Geldrop (NL); Danny Maria Hubertus Philips, Son en Breugel (NL); Marcio Alexandre Cano Miranda, Curitiba (BR); Oleksiy Galaktionov, Geldrop (NL); Manish Ranjan, Eindhoven (NL); Albert Pieter Rijpma, Veldhoven (NL); Kursat Bal, Arnhem (NL); Roger Wilhelmus Antonius Henricus Schmitz, Helmond (NL); Alain Louis Claude Leroux, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 165 days.

This patent is subject to a terminal disclaimer.

(21) Appl. No.: 13/408,471

(22) Filed: Feb. 29, 2012

(65) Prior Publication Data

US 2012/0229782 A1   Sep. 13, 2012

Related U.S. Application Data

(60) Provisional application No. 61/450,392, filed on Mar. 8, 2011, provisional application No. 61/489,524, filed on May 24, 2011.

(51) Int. Cl.
G03B 27/52 (2006.01)
G03B 27/42 (2006.01)
G03F 7/20 (2006.01)

(52) U.S. Cl.
CPC ........ *G03F 7/70933* (2013.01); *G03F 7/70891* (2013.01)
USPC .............................. 355/30; 355/53

(58) Field of Classification Search
USPC .................... 355/30, 52, 53, 55, 67
See application file for complete search history.

(56) References Cited

U.S. PATENT DOCUMENTS 6,962,825 B2 * 11/2005 Murakami ................... 438/5
6,970,228 B1 * 11/2005 Aoki et al. .................. 355/30

(Continued)

FOREIGN PATENT DOCUMENTS

WO      2005/083759 A1    9/2005

*Primary Examiner* — Hung Henry Nguyen
(74) *Attorney, Agent, or Firm* — Pillsbury Winthrop Shaw Pittman LLP

(57) ABSTRACT

A lithographic apparatus includes a substrate table constructed to hold a substrate, a projection system configured to project a patterned radiation beam through an opening and onto a target portion of the substrate, and a conduit having an outlet in the opening. The conduit is configured to deliver gas to the opening. The lithographic apparatus further includes a cooling apparatus controlled by a control system. The cooling apparatus is configured to cool the gas such that gas which travels from the opening to the substrate has a predetermined temperature when the gas is incident upon the substrate.

19 Claims, 5 Drawing Sheets

(56) References Cited

U.S. PATENT DOCUMENTS

| | | |
|---|---|---|
| 7,633,597 B2 * | 12/2009 | Namba et al. .................... 355/30 |
| 7,738,075 B2 * | 6/2010 | Hiar et al. ........................ 355/30 |
| 2001/0016302 A1 | 8/2001 | Hirayanagi et al. |
| 2002/0163793 A1 | 11/2002 | Jonkers |
| 2003/0151728 A1 * | 8/2003 | Nishi ............................... 355/30 |
| 2004/0174514 A1 * | 9/2004 | Kawahara ........................ 355/72 |
| 2005/0175497 A1 * | 8/2005 | Arai et al. ......................... 422/3 |
| 2007/0079525 A1 | 4/2007 | Sogard |
| 2007/0209226 A1 | 9/2007 | Coon |
| 2009/0303455 A1 * | 12/2009 | Kemper et al. ................. 355/67 |

* cited by examiner

LITHOGRAPHIC APPARATUS AND DEVICE MANUFACTURING METHOD

CROSS-REFERENCE TO RELATED APPLICATIONS

This application claims the benefit of priority from U.S. Provisional Patent Application Nos. 61/450,392, filed Mar. 8, 2011, and 61/489,524, filed May 24, 2011, the contents of both of which are incorporated herein by reference in their entireties.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In order to project a pattern onto a substrate with a desired accuracy using an EUV lithographic apparatus it is desirable to control the temperature of the substrate. This is because an uncontrolled change of the substrate temperature may cause the substrate to expand or contract such that the projected pattern is not positioned with a desired accuracy on the substrate (e.g. is not overlaid with a desired accuracy on a pattern already present on the substrate).

SUMMARY

According to an aspect of the invention, there is provided a lithographic apparatus comprising a substrate table constructed to hold a substrate, a projection system configured to project a patterned radiation beam through an opening and onto a target portion of the substrate, and a conduit having an outlet in the opening, the conduit being configured to deliver gas to the opening, wherein the lithographic apparatus further comprises a cooling apparatus controlled by a control system and configured to cool the gas such that gas which travels from the opening to the substrate has a predetermined temperature when the gas is incident upon the substrate.

The predetermined temperature may be a reference temperature of the lithographic apparatus.

The predetermined temperature may be below a reference temperature of the lithographic apparatus.

The cooling apparatus may be configured to cool the temperature of the gas to at least 5K below the reference temperature of the lithographic apparatus.

The cooling apparatus may be configured to cool the temperature of the gas to at least 10K below the reference temperature of the lithographic apparatus.

The opening may be defined by an opening-defining wall connected to walls of the projection system, and wherein a gap and/or insulating material is provided between the opening defining wall and the walls of the projection system.

The opening defining wall may be formed from ceramic or glass.

Thermal conductance between the opening defining wall and adjacent parts of the lithographic apparatus may be less than 0.5 W/K.

The conduit may comprise a pipe, and a gap and/or insulating material may be provided between the pipe and walls of the projection system.

The lithographic apparatus may further comprise a metrology apparatus configured to measure overlay of a pattern projected onto the substrate by the lithographic apparatus, wherein the control system is configured to determine an adjustment of the predetermined temperature of the gas based upon an output from the metrology apparatus.

The outlet may be an annular slit. The corners of the annular slit may be rounded.

The conduit may comprise an annular chamber that extends around the opening, and wherein a baffle is provided in the annular chamber.

The baffle may be connected to a heat sink and/or is connected to an active cooling apparatus.

The lithographic apparatus may further comprise a heat pipe connected to a wall of the opening at one end and connected to a temperature control apparatus at an opposite end.

The lithographic apparatus may further comprise a measurement apparatus configured to measure infrared radiation reflectivity of the substrate.

The control system may be configured to determine an adjustment of the predetermined gas temperature to take into account the measured infrared reflectivity of the substrate.

The reference temperature of the lithographic apparatus may be between 20° C. and 23° C.

According to an aspect of the invention, there is provided a device manufacturing method comprising projecting a patterned beam of radiation through an opening in a projection system onto a substrate, and delivering gas to the opening in the projection system via a conduit which has an outlet in the opening, wherein the method further comprises cooling the gas using a cooling apparatus such that the gas has a predetermined temperature when the gas is incident upon the substrate after passing through the opening.

The predetermined temperature may be a reference temperature of the lithographic apparatus.

The predetermined temperature may be below a reference temperature of the lithographic apparatus.

The opening in the projection system may be defined by a opening defining wall connected to walls of the projection system, and the thermal conductance between the opening defining wall and other parts of the lithographic apparatus may be less than half of a heat capacity per unit time of the gas.

According to an aspect of the invention, there is provided a lithographic apparatus comprising a substrate table constructed to hold a substrate, and a projection system configured to project a patterned radiation beam onto a target portion of the substrate, wherein the lithographic apparatus includes a conduit configured to deliver gas to an opening in the projection system through which the patterned radiation beam may pass onto the target portion of the substrate and through which the gas may travel to the substrate, the lithographic apparatus further comprising a cooling apparatus controlled by a control system to cool the gas such that the gas has a predetermined temperature when it is incident upon the substrate.

According to an aspect of the invention, there is provided a lithographic apparatus comprising a substrate table constructed to hold a substrate, a projection system configured to project a patterned radiation beam through an opening and onto a target portion of the substrate, a conduit configured to deliver gas through the opening in the projection system and to the substrate, and a cooling apparatus controlled by a control system and configured to cool the gas to a predetermined temperature when the gas is incident upon the substrate.

According to an aspect of the invention, there is provided a device manufacturing method comprising projecting a patterned beam of radiation through an opening in a projection system onto a substrate, wherein the method comprises delivering gas to the projection system opening via a conduit, the gas being cooled by a cooling apparatus such that the gas has a predetermined temperature when it is incident upon the substrate after passing out of the opening.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
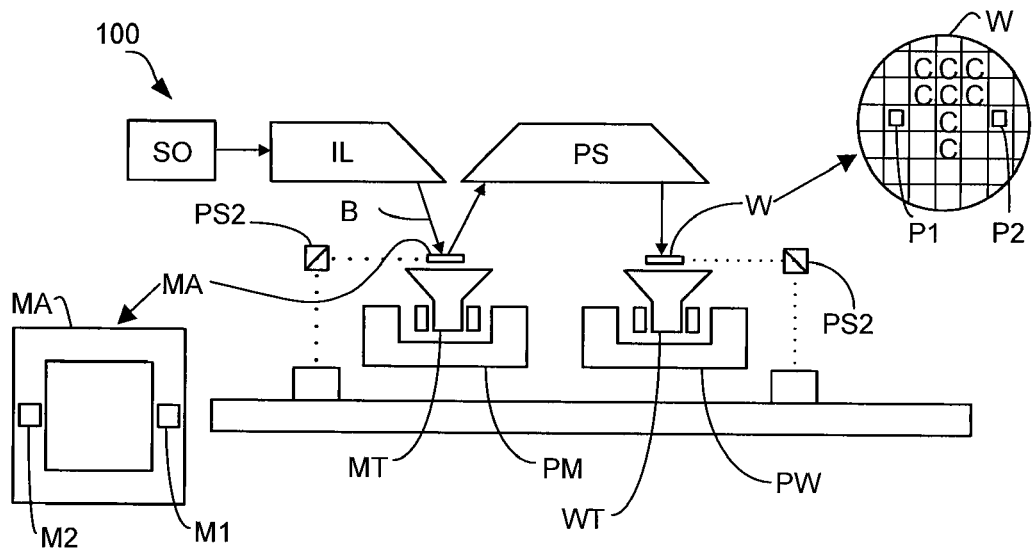
FIG. 1 schematically depicts a lithographic apparatus according to an embodiment of the invention.

FIG. 1 schematically depicts a lithographic apparatus 100 according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination reaching optical components of the lithographic apparatus.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP"), the desired plasma can be produced by irradiating a fuel, such as a droplet, stream or cluster of material having the desired line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
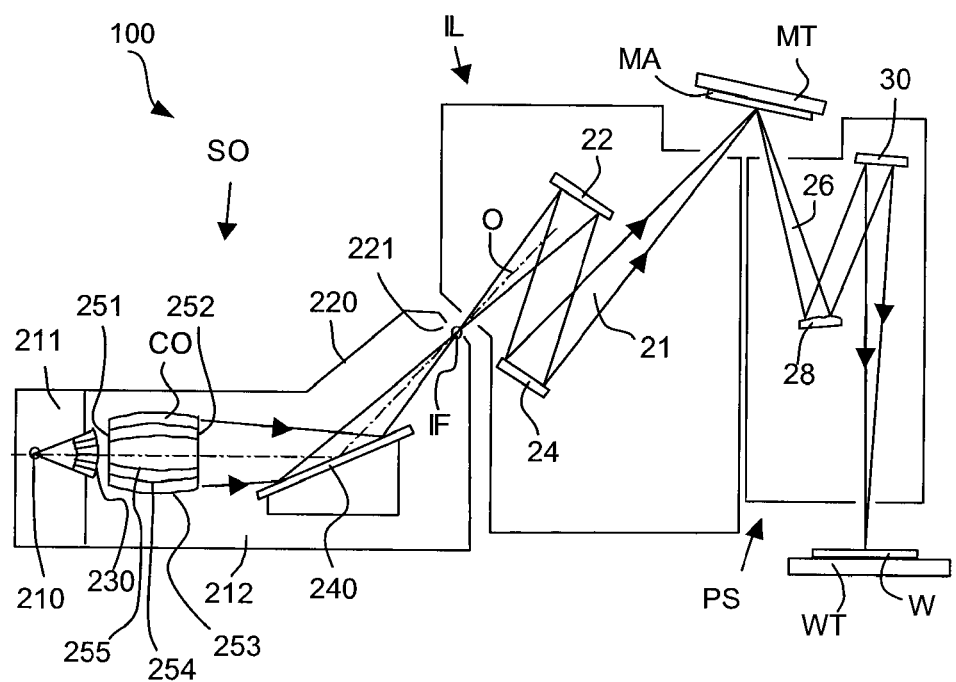
FIG. 2 schematically depicts a more detailed view of the apparatus of FIG. 1, including a discharge produced plasma source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be desired for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
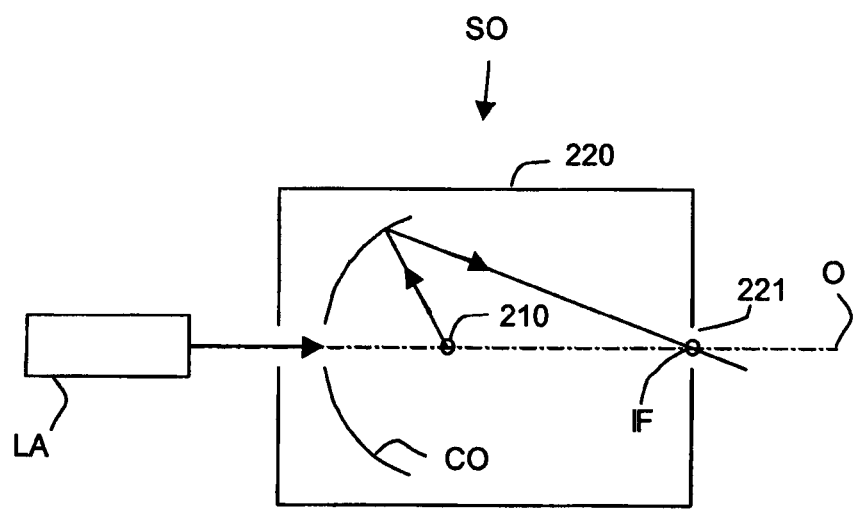
FIG. 3 schematically depicts a view of an alternative source collector module of the apparatus of FIG. 1, the alternative being a laser produced plasma source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
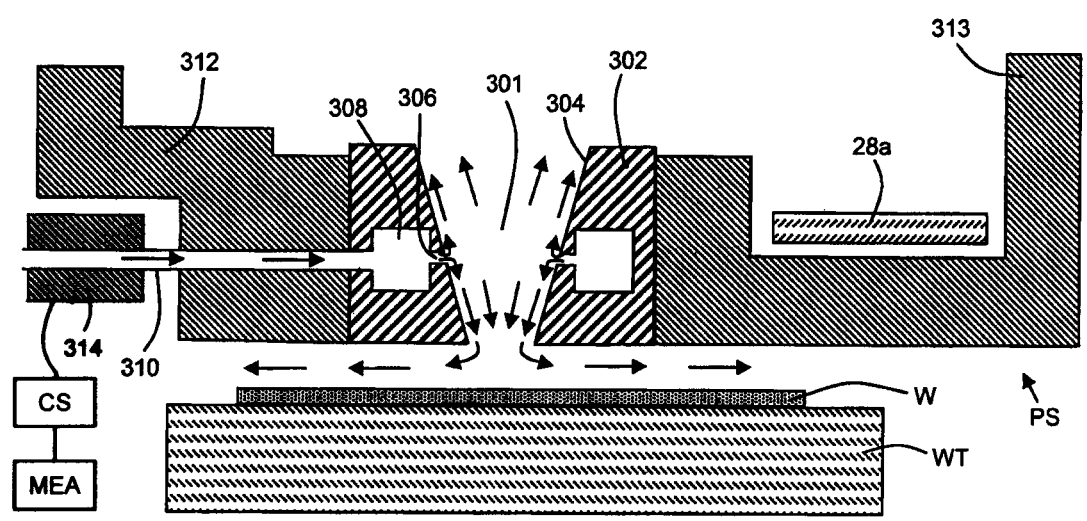
FIG. 4 schematically depicts part of a projection system and a substrate table of the lithographic apparatus.

FIG. 4 shows schematically in cross-section a lower portion of the projection system PS. The projection system PS includes an opening 301 formed by a sloped inner surface 304 of a duct-defining wall 302, also referred to hereinafter as the opening-defining wall 302. An annular slit 306 formed in the sloped inner surface 304 is configured to deliver gas into the opening 301. An annular chamber 308 is connected to the annular slit 306 and is also connected to a pipe 310 which extends through a wall 312 of the projection system. The pipe 310, annular chamber 308 and annular slit 306 may together be considered to form a conduit which delivers gas to the opening 301. The conduit may have any other suitable form. The conduit may for example comprise a plurality of pipes which run adjacent to one another, such that the pipe 310 is one of a plurality of pipes. In this description references to a pipe 310 may be considered to encompass a plurality of pipes.

The annular slit is an example of an outlet. The outlet may have any suitable form. The outlet may for example comprise a plurality of holes. The plurality of holes may be distributed around the outlet. The holes may be rectangular, square, circular, or may have any other suitable shape.

A cooling apparatus 314 is provided and may be used to cool a portion of the pipe 310. The cooling apparatus 314 may be in thermal contact with the portion of the pipe 310, and may for example encircle the portion of the pipe. The cooling apparatus 314 may be in thermal contact with the conduit. In an embodiment, the cooling apparatus 314 may cool the gas before it enters the pipe 310.

The temperature of the cooling apparatus 314 may be controlled by a control system CS. The control system CS may for example comprise a processor or other electronics. The control system CS may receive one or more measured parameters (e.g. the temperature of the substrate table WT and/or the opening defining wall 302) and may determine an adjustment of the temperature of the cooling apparatus 314 based on those parameters.

A mirror 28a located adjacent to a wall 313 of the projection system is also shown in FIG. 4. The mirror 28a performs the same function as the mirror 28 shown in FIG. 2, i.e. it is used to reflect radiation from a mask MA (see FIG. 2) to a substrate W (often in combination with other mirrors). Although the position of the mirror 28a shown in FIG. 4 is different from the position of the mirror 28 shown FIG. 2, this is merely for ease of illustration and does not have a material effect upon aspects of the invention.

In use, a substrate W supported by a substrate table WT is positioned beneath the projection system PS as shown. EUV radiation is patterned by a mask (not shown in FIG. 4) and is then projected through the opening 301 onto the substrate W, thereby exposing a pattern onto the substrate. The EUV radiation may be focused as a converging radiation beam such that an outer portion of the EUV radiation beam is substantially parallel to the sloped inner surface 304 of the opening defining wall 302.

It is desirable to reduce the likelihood that contamination (e.g. gas-phase organic compounds coming from resist on the substrate W) will travel from the substrate W into the interior of the projection system PS. This is because the contamination may accumulate on optical surfaces such as the mirror 28a and cause the reflectivity of those optical surfaces to be reduced. This may in turn reduce the intensity of EUV radiation available for projection onto the substrate W, and therefore reduce the throughput of the lithographic apparatus (i.e. the number of substrates which may be patterned per hour by the lithographic apparatus).

Gas which flows into the opening 301 through the annular slit 306 reduces the likelihood of contamination passing from the substrate W through the opening 301 and into the projection system PS. The flow of gas is schematically represented by arrows in FIG. 4. The gas travels through the pipe 310 into the annular chamber 308. The gas travels within the annular chamber 308 such that the pressure of gas at the entrance to the annular slit 306 is substantially equal around the circumference of the annular chamber. The annular chamber 308 may include a baffle (not shown) which acts to encourage the gas to travel within the annular chamber, thereby assisting with equalisation of the pressure of the gas within the annular chamber. Gas passes through the annular slit 306 and into the opening 301. A proportion of the gas travels upwards into the projection system PS. The remainder of the gas travels downwards, passing out of the opening 301 and then travelling away from the opening in a gap between the projection system PS and the substrate W. The flow of gas out of the opening 301 prevents or suppresses the passage of contamination from the substrate W into the projection system PS.

It is desirable to control the temperature of the substrate W. This is because an uncontrolled change of the substrate temperature may cause the substrate to expand or contract such that a projected pattern is not positioned with a desired accuracy on the substrate (e.g. is not overlaid with a desired accuracy on a pattern already present on the substrate). The flow of gas from the opening 301 onto the substrate W could heat the substrate in an unwanted manner. It may be desirable to prevent the flow of gas from heating the substrate in an unwanted manner.

In an embodiment, the temperature of the gas is controlled such that when the gas is incident upon the substrate the gas has a desired temperature. The temperature of the gas may be controlled such that the temperature of the substrate is not modified by the gas to such an extent that it causes unacceptable overlay errors to occur in the lithographic apparatus.

The lithographic apparatus may have a reference temperature, which may for example be around 295 Kelvin (e.g. around room temperature which may be between 20 and 23° C.) or may be some other temperature. The reference temperature may be the temperature at which one or more components of the lithographic apparatus are held during operation of the lithographic apparatus. The lithographic apparatus may hold (or endeavour to hold) one or more of the substrate W, substrate table WT, projection system walls 312, 313 and opening defining wall 302 at the reference temperature. If the lithographic apparatus were to operate without the flow of gas, then the substrate W, substrate table WT, projection system walls 312, 313 and opening defining wall 302 may be at the reference temperature (or substantially at the reference temperature). An exception to this may be a portion of the substrate which is being exposed; this may have a higher temperature due to heating caused by EUV and infrared radiation incident on that portion of the substrate. The infrared radiation may for example arise from an EUV emitting plasma 210 or a laser LA used in the generation of the EUV emitting plasma (see FIG. 3).

When gas is flowing through the apparatus it may cause heating of the substrate W, even if the gas which is introduced into the pipe 310 initially has the same temperature as other components of the lithographic apparatus. This is because gas acquires heat as it travels to the substrate W, the heat then being transferred to the substrate from the gas. This heating of the substrate may lead to unacceptable overlay errors occurring during exposure of the substrate.

The mechanism via which the gas acquires heat as it travels to the substrate W is a consequence of the velocity at which the gas travels. Gas which is travelling through the pipe 310 to the annular chamber 308 will have a relatively high velocity (e.g. 100 m/s or greater). This relatively high velocity of the gas will cause a reduction of the temperature of the gas as it is flowing through the pipe 310. This may be understood by considering an example in which the gas is adiabatic (i.e. with no temperature exchange taking place between the pipe 310 and the gas). If the gas is adiabatic then the total energy of the gas must remain constant. If the gas is stationary or slow moving (e.g. 10 m/s or less) when it enters the pipe 310 then all of the energy of the gas is thermal energy, and this is manifest as the temperature of the gas. However, when the gas is travelling at a relatively high velocity in the pipe 310, the gas has significant kinetic energy due to its velocity. Since the total energy of the gas remains the same, the thermal energy of the gas (and hence its temperature) is reduced. Thus, in the adiabatic case, when a gas flows at a relatively high velocity the temperature of the gas will be reduced.

The gas in an embodiment of the invention may flow at a relatively high velocity through the pipe 310, and as a result of this relatively high velocity, the temperature of the gas is reduced. If the gas and the projection system wall 312 both have the same initial temperature (the initial gas temperature being the temperature of the gas before it flows through the pipe 310), then when the gas is flowing through the pipe 310 it will have a temperature which is lower than the temperature of the projection system wall. Because the gas has a lower temperature than the projection system wall 312, heat will flow from the projection system wall to the gas as it travels through the pipe 310. In an embodiment, the gas may flow through the pipe 310 at a relatively low velocity, in which case the temperature of the gas will not be reduced. However, the temperature of the gas will be reduced when the gas flows through the annular slit 306.

The annular slit 306 through which the gas passes into the opening 301 is relatively constricted. Consequently, the gas will travel through the annular slit 306 at a relatively high velocity, and this will cause the temperature of the gas to be reduced (e.g. by several Kelvin). If the gas has a lower temperature than the opening defining wall 302 as it travels through the annular slit 306, heat will be transferred from the opening defining wall to the gas.

The gas may have a relatively high velocity when it enters the opening 301. However, the gas decelerates when it is incident upon the surface of the substrate W, since the substrate prevents the gas from continuing to travel downwards and forces the gas to change direction. As a result of this deceleration, kinetic energy in the gas is converted to thermal energy. Since heat has been transferred to the gas from the pipe 310 and the opening defining wall 302, the gas has a temperature which is higher than its temperature before it entered the pipe. The temperature of the gas may for example be higher than the reference temperature of the lithographic apparatus. It is this higher temperature of the gas which may cause undesirable heating of the substrate W.

In an embodiment, the opening defining wall 302 may be insulated to reduce the amount of heat which may flow to the opening defining wall from the projection system walls 312, 313 (or other parts of the lithographic apparatus). This reduces the amount of heat that may be transferred to the gas as it passes through the annular slit 306. The insulation may for example comprise providing a gap and/or insulating material between the opening defining wall 302 and the projection system walls 312, 313.

In an embodiment, the opening defining wall 302 may be constructed from an insulating material. For example, the opening defining wall 302 may be constructed from a ceramic, e.g. Macor ceramic which is available from Corning Inc. of Corning, USA (or some other suitable ceramic). The opening defining wall 302 may be formed from glass. The opening defining wall 302 may be formed from a metal which has a lower thermal conductivity than some other metals. For example, the opening defining wall 302 may be formed from stainless steel, which may provide structural strength and which has a thermal conductivity significantly lower than that of aluminium.

In an embodiment, the pipe 310 is insulated to reduce the amount of heat which may flow to the pipe from the projection system wall 312 (or other parts of the lithographic apparatus). This reduces the amount of heat that may be transferred to the gas during its passage through the pipe 310. The insulation may for example comprise providing a gap and/or insulating material between the pipe 310 and the projection system wall. The insulation may for example comprise providing an insulating material between the pipe 310 and the opening defining wall 302 (at the end of the pipe which is connected to the opening defining wall).

In an embodiment, the pipe 310 may be constructed from an insulating material, or from a metal (e.g. stainless steel) which has a lower thermal conductivity than some other metals.

Insulation of the pipe and/or the opening defining wall may not be sufficient to prevent the transfer of an undesirable amount of heat to the gas as it travels to the substrate W. Therefore, in an embodiment of the invention, the cooling apparatus 314 may be used to cool the gas.

The cooling apparatus 314 may cool the gas by an amount which is such that the gas has the reference temperature of the lithographic apparatus when it is incident upon the substrate W (or has some other desired temperature, or has a temperature which is closer to a desired temperature than would be the case if the cooling apparatus were not present). In an embodiment, the temperature of the gas when the gas is incident upon the substrate W may differ from a desired temperature (e.g. the reference temperature), but that difference may be sufficiently small that it does not cause an unacceptable reduction of the overlay accuracy of the lithographic apparatus.

The cooling apparatus 314 may cool the gas by an amount which is sufficient to compensate for (or substantially compensate for) gas heating which arises due to the relatively high velocity passage of the gas through the annular slit 306 and/or the pipe 310.

The reduction of gas temperature by the cooling apparatus 314 that is desired in order that the gas is incident upon the substrate W with a desired temperature may be determined using a thermal model. In the following explanation of the thermal model the gas is assumed to be hydrogen gas. However, the thermal model may be applied to other gases.

Figure 5:
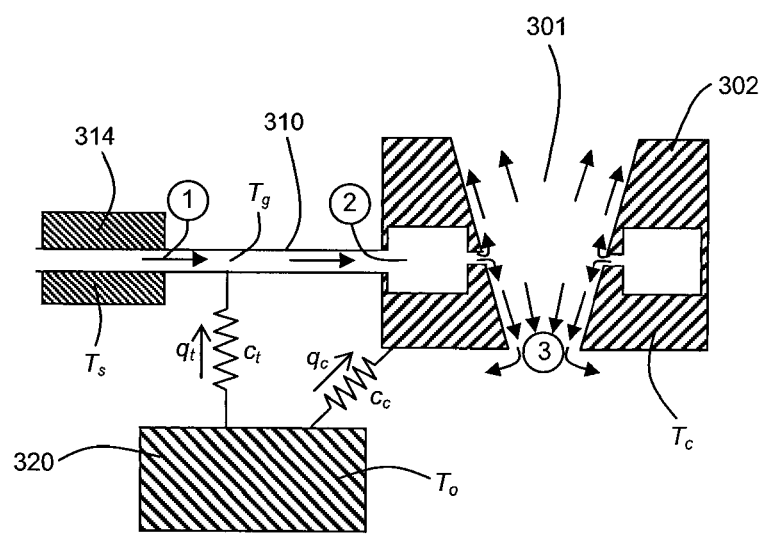
FIG. 5 is a thermal model which schematically depicts the part of the projection system shown in FIG. 4.

FIG. 5 shows a thermal model which represents the cooling apparatus 314, pipe 310 and opening defining wall 302. Also shown in the thermal model in FIG. 5 is a mass 320 which represents parts of the lithographic apparatus from which heat may pass to the pipe 310 and the opening defining wall 302 (referring to FIG. 4, the parts may correspond with for example the projection system walls 312, 313). In order to avoid over complicating FIG. 5 some of the reference numerals used in FIG. 4 are omitted from FIG. 5.

The thermal model provides an estimate of the heat flow into and out of the hydrogen gas as it travels to the substrate. The temperature of the cooling apparatus 314 is indicated as $T_s$. The hydrogen gas has this temperature after it has passed through the cooling apparatus 314. The temperature of the opening defining wall 302 is indicated as $T_c$, and the temperature of the mass 320 is indicated as $T_0$. $T_0$ may for example be the reference temperature of the lithographic apparatus, and may be the temperature of the walls 312, 313 of the projection system (see FIG. 4). In this example $T_0$ may be around 295 K.

The temperature $T_g$ of the hydrogen gas as it travels through the apparatus is considered in the model at three locations, which are indicated as 1, 2 and 3 in FIG. 5.

The gas can pick up a heat per unit time $q_t$ as it travels through the pipe 310. The pipe 310 is coupled to the mass 320 with a thermal conductance $c_t$, through which the same heat per unit time $q_t$ passes to the pipe (assuming that the system shown in FIG. 5 is in equilibrium). Similarly, the gas can pick up a heat per unit time $q_c$ as it travels through the annular slit of the opening defining wall 302. The opening defining wall 302 is coupled to the mass 320 with a thermal conductance $c_c$, through which the same heat per unit time $q_c$ passes to the opening defining wall (assuming that the system shown in FIG. 5 is in equilibrium).

The hydrogen gas has a heat capacity per unit time $c_g$, which is $$c_g = \frac{7\Phi}{2T_0} \quad (2)$$

where $\phi$ is the hydrogen supply flow rate which may be in the range 5-20 Pa m³/s. The factor 7/2 is related to the specific heat at constant pressure for a diatomic gas. In the following discussion, the gas temperature $T_g$ is the so-called total temperature, which comprises both thermal energy and macroscopic kinetic energy of the gas. The total temperature can only change due to heat exchange with walls of the pipe 310 and opening defining wall 302; it is invariant under pressure drops and changes in velocity.

The following equations may be written:

$$T_{g1} = T_s, \quad (3)$$

$$T_{g2} = T_0 + (T_{g1} - T_0)e^{-c_t/c_g}, \quad (4)$$

$$T_{g3} = (T_c + \Delta) + (T_{g2} - T_c - \Delta)e^{-c_{ce}/c_g}, \quad (5)$$

$$q_t = c_g(T_{g2} - T_{g1}), \quad (6)$$

$$q_c = c_g(T_{g3} - T_{g2}), \quad (7)$$

$$T_c = T_0 - \frac{q_c}{c_c}, \quad (8)$$

where $T_{g1}$, $T_{g2}$, and $T_{g3}$ are the temperature of the gas at locations 1, 2 and 3 in FIG. 5, respectively. The equations have unknowns $T_{g1}$, $T_{g2}$, $T_{g3}$, $T_c$, $q_t$, and $q_c$. The parameter $c_{ce}$ models the heat exchange between opening defining wall 302 and the hydrogen gas. Estimated values range from 0.1 W/K to 0.4 W/K. The parameter $\Delta$ is a positive temperature offset that represents the effect of heat transport in the gas when the gas is travelling at a high velocity. The parameter $\Delta$ is the difference between the total temperature and the so-called recovery temperature (i.e. the temperature of a gas layer adjacent to a wall if the wall did not exchange any heat with the gas). For the simple case of gas flowing over a flat surface, it can be derived that $$\Delta \approx (1 - \sqrt{Pr})\frac{u^2}{2C_P} \approx \left(\frac{u}{440 \text{ ms}^{-1}\text{K}^{-1/2}}\right)^2, \quad (9)$$

where Pr=0.7 is the Prandtl number for hydrogen, u is the free-stream velocity of the gas (or the velocity in the center of a flow channel), and $C_p$=14.5 kJ/kg K is the specific heat at constant pressure of hydrogen. At the annular slit of the opening defining wall 302, the flow of the gas is restricted, and as a result the gas travels at a high velocity (e.g. u=1300 m/s). As a result, the parameter Δ may be several Kelvin. For example the parameter Δ may be between 7 and 9 K. The value 7 K is used in this example of the thermal model.

A goal to be achieved using the thermal model may be that the gas temperature at location 3 is equal to the reference temperature $T_0$ (e.g. 295 K), i.e. $T_{g3}=T_0$. As explained above, the pipe 310 and the opening defining wall 302 may be insulated such that the thermal conductance $c_t$ between the mass 320 and the pipe 310 is limited, and the thermal conductance $c_c$ between the mass and the opening defining wall 302 is limited. During operation of the lithographic apparatus these thermal conductances may be fixed, and the flow rate of the gas may be fixed. However, the temperature $T_s$ of the cooling apparatus 314, and hence the temperature $T_1$ of the gas, may be adjustable.

Given the model parameters, a desirable temperature for the cooling apparatus 314 may be:

$$T_s = T_1 = T_0 - \Delta \frac{c_c(1-\varepsilon_{ce})}{\varepsilon_t[c_g(1-\varepsilon_{ce})+c_c\varepsilon_{ce}]}, \quad (10)$$

where $$\varepsilon_{ce} \equiv e^{-c_{ce}/c_g}, \quad (11)$$

$$\varepsilon_t \equiv e^{-c_t/c_g} \quad (12)$$

Figure 6:
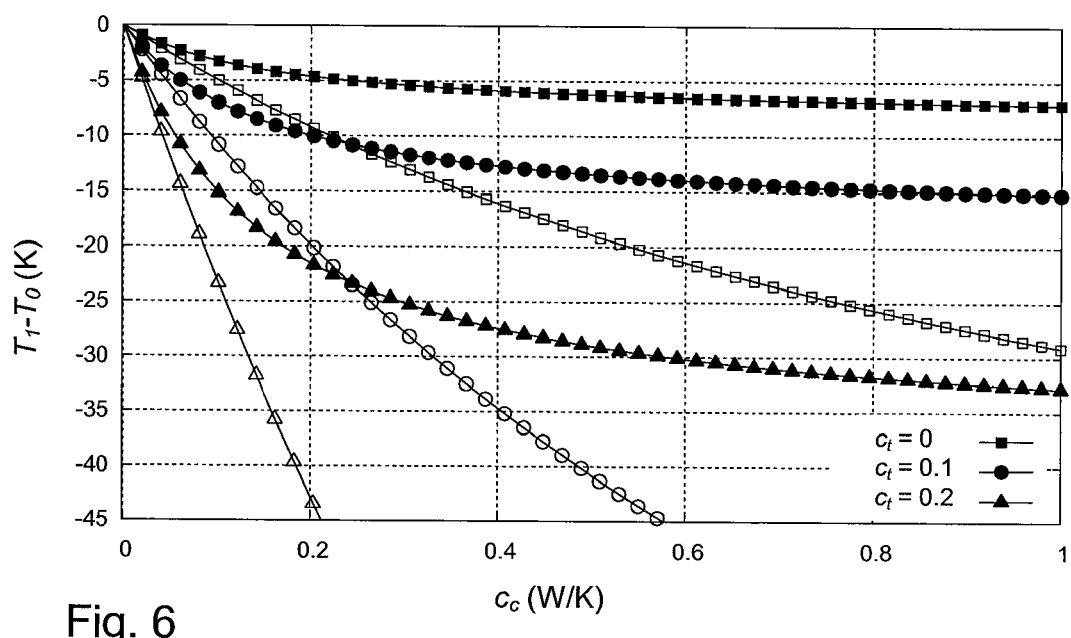
FIG. 6 is a graph generated using the thermal model of FIG. 5.

FIG. 6 is a graph which shows the temperature of the cooling apparatus 314 that is desired in order to provide hydrogen gas to the substrate at the reference temperature $T_0$ (e.g. 295 K), the temperature being shown as a function of the thermal conductance $c_c$ between the mass 320 and the opening defining wall 302. The temperature of the cooling apparatus 314 is indicated on the vertical axis relative to the reference temperature $T_0$ (i.e. is shown as $T_1-T_0$). Plots in FIG. 6 are shown for heat exchange between the hydrogen gas and the opening defining wall 302 of $c_{ce}$=0.1 W/K (filled symbols) and $c_{ce}$=0.3 W/K (open symbols). As indicated in FIG. 6, plots are shown for thermal conductance between the mass 320 and the pipe 310 of $c_t$=0, $c_t$=0.1 and $c_t$=0.2 W/K.

As may be seen from the plots, the temperature $T_S$ (=$T_1$) of the cooling apparatus 314 may be several Kelvin below the reference temperature $T_0$ of the lithographic apparatus. The value of the desired temperature difference reduces as the thermal conductance $c_c$ between the mass 320 and the opening defining wall 302 reduces (i.e. with increasingly effective insulation between the opening defining wall 302 and other components of the lithographic apparatus). Similarly, the value of the desired temperature difference reduces as the thermal conductance $c_t$ between the mass 320 and the pipe 310 reduces. From a comparison of the filled symbols and the open symbols it may be seen that the size of the desired temperature difference reduces as the heat exchange between the hydrogen gas and the opening defining wall 302 reduces.

Figure 7:
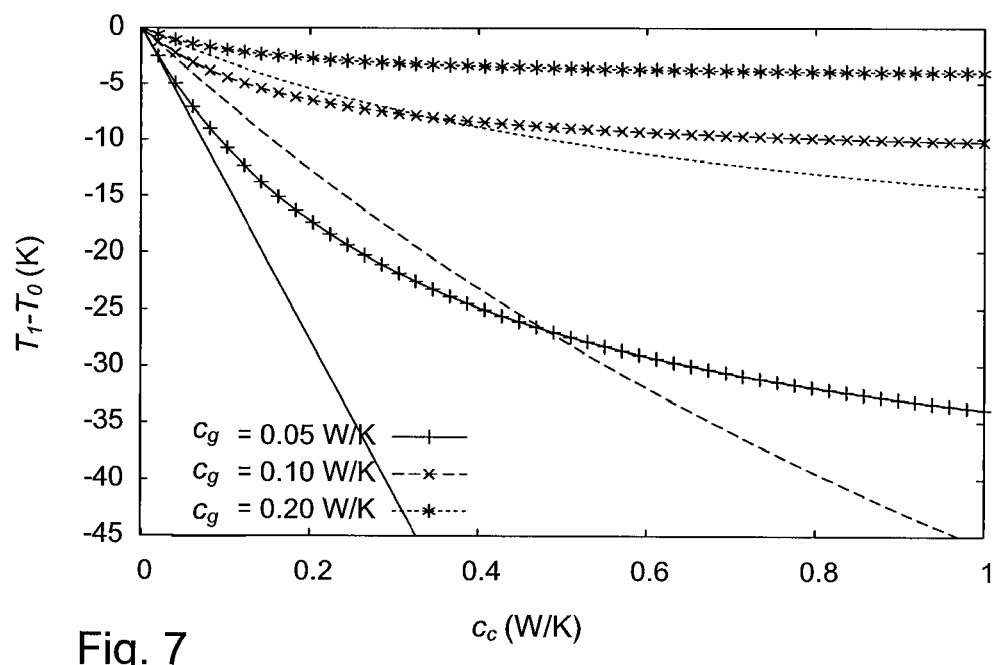
FIG. 7 is a graph generated using the thermal model of FIG. 5.

The plots shown in FIG. 6 were generated using the assumption that the hydrogen gas had a heat capacity per unit time $c_g$ of 0.128 W/K. However, this will depend upon the volume of gas that is delivered to the opening 301 per unit time, which in turn may depend upon the design of the lithographic apparatus. It is instructive therefore to consider the effect of different heat capacities per unit time. FIG. 7 is a graph which shows the temperature of the cooling apparatus 314 that is desired in order to provide hydrogen gas at the substrate at the reference temperature $T_o$ (e.g. 295 K) for three different heat capacities per unit time of the gas. Plots are shown for two different parameters $c_{ce}$ of heat exchange between the opening defining wall 302 and the hydrogen gas, lines only being indicated for $c_{ce}$=0.1 W/K and lines with data points being indicated for $c_{ce}$=0.3 W/K. In common with FIG. 6, the temperature of the cooling apparatus 314 is shown as a function of the thermal conductance $c_c$ between the mass 320 and the opening defining wall 302. An assumption of no thermal conductance $c_t$ between the mass 320 and the pipe 310 was used when generating FIG. 7.

In common with FIG. 6, FIG. 7 shows that the temperature $T_s$ (=$T_1$) of the cooling apparatus 314 may be several Kelvin below the reference temperature $T_0$ of the lithographic apparatus. As may be seen from the plots in FIG. 7, increasing the heat capacity per unit time of the gas reduces the size of the desired temperature difference between the cooling apparatus 314 and the reference temperature $T_0$. This is because increasing the heat capacity per unit time of the gas leads to a smaller temperature increase of the gas for the same amount of heat extracted from the opening defining wall 302.

In general, the larger the heat capacity per unit time $c_g$ of the gas the more effective the cooling provided by the cooling apparatus 314.

It may be desirable to configure the lithographic apparatus such that the heat capacity per unit time of the gas is more than twice as big as the sum of the thermal conductance $c_c$ between the mass 320 and the opening defining wall 302 and the thermal conductance $c_t$ between the mass 320 and the pipe 310, i.e. ($c_c+c_t$)<2$c_g$.

In an embodiment, the thermal conductance $c_c$ between the mass 320 and the opening defining wall 302 may be less than 0.5 W/K, may be less than 0.2 W/K and may be less than or equal to 0.1 W/K (where the mass is representative of adjacent parts of the lithographic apparatus such as the walls 312, 313 of the projection system). If the thermal conductance $c_c$ between the mass 320 and the opening defining wall 302 is high (e.g. 1 W/K or more) then cooling the gas may still reduce the amount of heat that is transferred from the gas to the substrate, but it may be difficult to deliver gas to the substrate at the reference temperature of the lithographic apparatus. In general, a higher thermal conductance $c_c$ between the mass 320 and the opening defining wall will reduce the effectiveness of gas cooling by the cooling apparatus 314 and will cause the gas to be delivered to the substrate at a non-optimal temperature or will require a larger temperature difference at the cooling apparatus (which may be difficult to achieve).

In an embodiment, the heat capacity per unit time of the gas may be such that 2$c_g$<($c_c+c_t$)<4$c_g$. Where this is the case, the gas may be delivered to the substrate at a temperature which is higher than the reference temperature. The temperature of the gas may however be significantly lower than the temperature that the gas would have if the cooling apparatus 314 was not present.

In an embodiment, the cooling apparatus 314 may cool the gas by 20 K or less, may cool the gas by 15 K or less, or may cool the gas by 10 K or less.

In an embodiment, instead of controlling the temperature of the gas such that the gas in the opening 301 is at the reference temperature of the lithographic apparatus (e.g. 295 K), the gas may be cooled such that it is delivered to the opening with a temperature that is lower than the reference temperature, such that the gas removes heat from the substrate W when it passes over the substrate.

Figure 8:
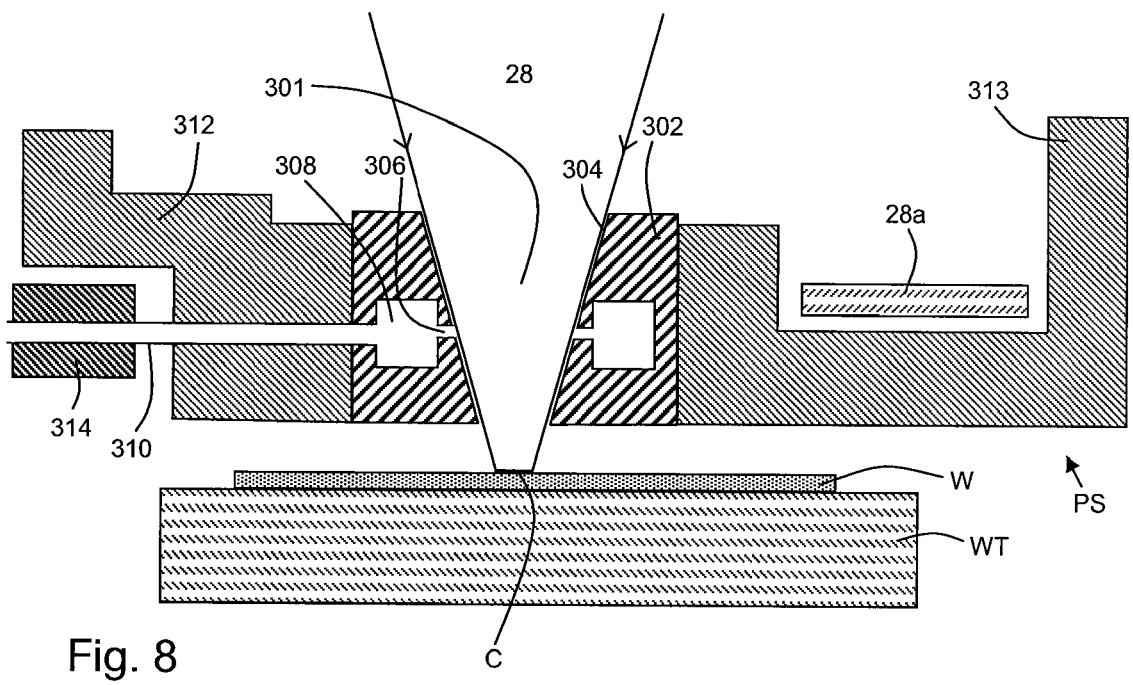
FIG. 8 schematically depicts the part of the projection system and substrate table shown in FIG. 4, including a representation of radiation incident upon a substrate.

FIG. 8 shows schematically in cross-section a lower portion of a lithographic apparatus according to an embodiment of the invention. FIG. 8 generally corresponds with FIG. 4, but FIG. 8 shows a patterned EUV radiation beam 28 incident upon a target portion C of the substrate W and does not show the flow of gas in the apparatus. The EUV radiation will cause localized heating of the target portion C of the substrate. In addition to the EUV radiation beam 28, infrared (IR) radiation (not shown) is also incident upon the target portion C of the substrate W. This IR radiation also causes localized heating of the target portion C of the substrate W.

A water cooling system (not illustrated) may be provided in the substrate table WT in order to remove heat that is applied to the target portion C of the substrate W by the EUV and IR radiation. However, the thermal conductance between the substrate table WT and the substrate W may be low because the substrate is supported by burls which extend upwardly from the substrate table and which provide a contact surface area between the substrate table and the substrate that is a small fraction of the area of the substrate. As a result, the cooling of the target portion C of the substrate W that is provided by the substrate table may be limited. The cooling of the substrate W provided by the substrate table WT may for example be capable of controlling the temperature of the substrate with an accuracy of 0.1 K or better, e.g. in the absence of heating due to EUV and IR radiation. However, if the amount of heat applied to the substrate by the EUV and IR radiation is too large, the substrate table WT may not have sufficient cooling capacity to cool the substrate W to a desired temperature. It may therefore be desirable to provide additional cooling of the substrate W using the gas which flows over the substrate.

As will be appreciated from FIG. 8, the heat applied to the substrate W by the EUV and IR radiation is applied to the target portion C of the substrate. In contrast to this, the cooling effect provided by the gas is not limited to the target portion C of the substrate W, but instead is spread out over a larger area of the substrate due to the passage of the gas over the surface of the substrate. In other words, the footprint of the cooling provided by the gas is larger than the footprint of the heating provided by the EUV and IR radiation.

Figure 9:
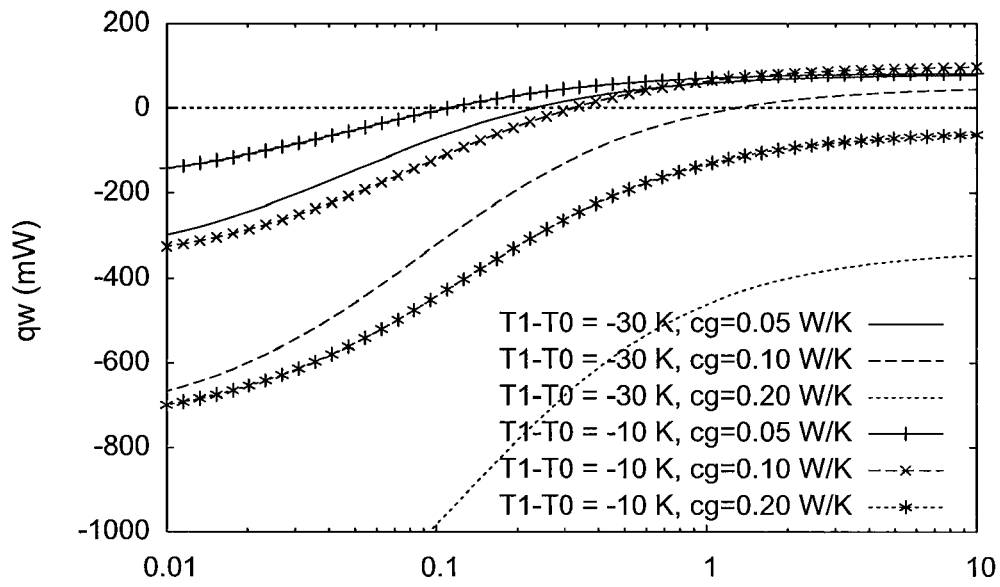
FIG. 9 is a graph generated using the thermal model of FIG. 5.

FIG. 9 is a graph which shows the heat load on the substrate W for two different values of $T_3$, the heat load being shown as a function of the thermal conductance $c_c$ between the mass 320 and the opening defining wall 302. The substrate heat load $q_w$ arising from the gas is calculated as:

$$q_w = f c_g (T_3 - T_0) \quad (13)$$

where f is the fraction of the gas delivered to the opening 301 that flows towards the substrate W (the remainder flowing into the projection system PS), $c_g$ is the heat capacity per unit time of the gas, $T_3$ is the temperature of the gas in the opening, and $T_0$ is the reference temperature of the lithographic apparatus. The fraction f may for example be in the range 0.15 to 0.3, and was set at 0.25 when the plots shown in FIG. 9 were calculated. If the gas were to not be cooled when it entered the pipe 310 then the substrate heat load $q_w$ arising from the gas would be around 100-150 mW. In an embodiment, cooling of the gas by the cooling apparatus may reduce the heat load $q_w$ arising from the gas to less than 50 mW, or less than or equal to 20 mW.

In FIG. 9 three plots are shown for $T_1 - T_0 = -30K$ and three plots are shown for $T_1 - T_0 = -10$ K. As may be seen in FIG. 9, when the thermal conductance $c_c$ between the mass 320 and the opening defining wall 302 is low (e.g. 0.01 W/K), the heat load $q_w$ at the substrate is negative. In other words, the temperature of the gas when it is incident upon the substrate is lower than the reference temperature of the lithographic apparatus. The gas thus acts to cool the substrate, the amount of cooling being determined by the size of the negative heat load $q_w$.

When the thermal conductance $c_c$ between the mass 320 and the opening defining wall 302 is higher (e.g. 0.1 W/K), the heat load is at zero or is approaching zero in three of the plots (those with the smallest gas heat capacity per unit time $c_g$ and/or the smallest temperature difference $T_1 - T_0$).

As the thermal conductance $c_c$ between the mass 320 and the opening defining wall 302 increases further, the heat load $q_w$ becomes positive for small gas heat capacities per unit time $c_g$ and/or temperature differences $T_1 - T_0$, meaning that the gas is applying heat to the substrate. For high gas heat capacities per unit time $c_g$ ($c_g = 0.2$ W/K) however, the heat load $q_w$ remains negative for the entire graph.

As noted further above, once the lithographic apparatus has been constructed, the thermal conductance $c_c$ between the mass 320 and the opening defining wall 302 may be fixed. FIG. 9 shows that for a given mass to opening defining wall thermal conductance $c_c$ the temperature of the cooling apparatus 314 and/or the gas heat capacity per unit time $c_g$ may be adjusted in order to deliver the gas to the opening 301 at the reference temperature of the lithographic apparatus, or in order to provide a desired amount of cooling of the substrate W.

As has been explained further above, the temperature of the gas in the opening 301 is affected by the temperature of the pipe 310 and the temperature of the opening defining wall 302. Because the pipe 310 and the opening defining wall 302 have significant masses, and because they may also have thermal connections to the projection system walls 312, 313, it may not be possible to instantaneously change the temperature of the gas delivered to the opening 301 to a desired different temperature in a stable manner. For this reason, a few minutes (e.g. around 10 minutes or more) may be allowed to lapse after changing the temperature of the cooling apparatus 314 in order to allow the temperatures of the pipe 310 and opening defining wall 302 to stabilize and therefore allow the temperature of the gas in the opening 301 to stabilize. For example, before beginning exposure of a batch of substrates (or some other quantity of substrates) the temperature of the gas may be selected using the cooling apparatus 314, and the gas temperature in the opening 301 may be allowed to stabilize by delaying exposure of substrates for a few minutes after the temperature of the cooling apparatus has been adjusted.

In an embodiment, a desirable adjustment to the temperature of the gas may be determined by monitoring the temperature of water passing out of a water-based cooling system in the substrate table WT. For example, the temperature of the water coming out of the substrate table WT may be compared with the temperature of the water entering the substrate table. The result of this comparison may be used to determine whether an adjustment of the temperature of the gas would be desirable in order to modify the temperature of the substrate W, and to determine the size of the adjustment. For example, the comparison may indicate that the temperature of the substrate W is higher than the reference temperature of the lithographic apparatus, whereupon it may be desirable to reduce the temperature of the cooling apparatus 314. The temperature of the substrate W may be measured in other ways, and the results of the measurement may be used to determine an adjustment of the temperature of the cooling apparatus 314.

In an embodiment, the effect of applying different temperatures to the gas using the cooling apparatus 314 may be measured in advance during calibration of the lithographic apparatus, and data obtained may be stored and subsequently used by the control system CS during operation of the lithographic apparatus to determine adjustments of the temperature of the cooling apparatus in response to measured temperatures of the substrate W (e.g. as measured by monitoring the temperature of the substrate table WT).

In an embodiment, the control system CS may take into account the results of thermal modelling, for example as described further above. The control system CS may for example take into account the thermal conductance to the pipe $c_t$, and the thermal conductance to the opening defining wall $c_c$. The control system CS may for example take into account the rate of flow of the gas, and the heat capacity per unit time of the gas.

In an embodiment, the temperature to which the cooling apparatus 314 cools the gas may be used (at least in part) to adjust the overlay achieved by the lithographic apparatus. Overlay may be considered to be a measurement of the accuracy with which the lithographic apparatus projects a pattern on top of a pattern already present on the substrate. The overlay achieved by the lithographic apparatus may be measured following exposure of a substrate by using a metrology apparatus (which may form part of the lithographic apparatus) to measure the positions of projected patterns relative to patterns previously present on the substrate. If a sub-optimal overlay is found which is indicative of the substrate having a temperature which is too high then the cooling provided by the cooling apparatus 314 may be increased. Conversely, if a sub-optimal overlay is found which is indicative of the substrate having a temperature which is too low then the cooling provided by the cooling apparatus 314 may be reduced. The cooling provided by the cooling apparatus 314 may be adjusted periodically in order to maintain a desired overlay accuracy.

The absorption of EUV radiation by the substrate may be relatively constant and predictable. However, the absorption of IR radiation by the substrate may vary significantly depending upon the form of the surface of the substrate. For example, if a structure has previously been exposed and processed on the substrate then the absorption of IR radiation by the substrate will depend upon the form of that structure. If the structure is formed from metal then the absorption of IR radiation will be less than the absorption would have been if the structure was formed from semiconductor. The adjustment of the temperature of the gas delivered from the cooling apparatus 314 may take into account the reflectivity to infrared radiation of substrates being exposed (or to be exposed) by the lithographic apparatus. In an embodiment, the reflectivity to infrared radiation of a substrate (which may be representative of a plurality of substrates) may be performed in a measurement apparatus MEA prior to exposure of the substrate (or plurality of substrates) by the lithographic apparatus. The measurement apparatus MEA may form part of the lithographic apparatus. For example, an apparatus may direct an infrared radiation beam at the substrate and detect radiation reflected from the substrate, thereby allowing the reflectivity of the substrate to the infrared radiation to be determined. The infrared radiation may for example be 10.6 μm, and may for example be provided by a laser. The apparatus MEA may for example be an apparatus which is used to perform measurements of other properties of the substrate (such an apparatus may be referred to as a metrology apparatus). The control system CS may adjust the temperature of the cooling apparatus 314 to take into account the IR reflectivity of substrates which are to be exposed (or are being exposed) by the lithographic apparatus (for example if the gas is being used to provide cooling which at least partially compensates for heating of the substrate caused by IR radiation). The measured IR reflectivity may also allow calculation of a maximum intensity of EUV radiation (and associated IR radiation) which may be used by the lithographic apparatus while maintaining a desired overlay accuracy.

As may be seen from FIGS. 6, 7 and 9, in order to provide gas at the substrate W which is at the reference temperature of the lithographic apparatus, the cooling apparatus 314 may need to have a temperature which is 10 K or more below the reference temperature. For example, the cooling apparatus may have a temperature between 275 and 285 K. The cooling apparatus 314 may be cooled using a water-based cooling system in which cold water is passed into the cooling apparatus, the cold water absorbing heat from the cooling apparatus and then passing out of the cooling apparatus. In an embodiment, the cooling apparatus 314 may be cooled using a Peltier cooler.

In an embodiment, the cooling apparatus 314 is cooled by the flow of gas through a constriction which increases the rate of flow of the gas and thereby lowers its temperature. In an embodiment, gas enters a gas tube at a gas inlet with a temperature of 295 K. The gas tube has a relatively wide diameter such that the gas flow velocity is low. Further downstream, the tube diameter is reduced, forming a constriction which is in thermal contact with a first heat exchanger. Inside the constriction the gas velocity is high and the gas temperature is substantially lower than at the gas inlet, e.g. 275 K. Because of the low temperature inside the constriction, the gas absorbs heat from the first heat exchanger, which is at a temperature of e.g. 285 K. After the constriction, the tube diameter increases again, leading to a lower gas velocity, and a temperature that is substantially higher than the initial temperature, e.g. 305 K. The warm gas then flows through a second heat exchanger, which is cooled by cooling water at the reference temperature of the lithographic apparatus (e.g. 295 K), thus reducing the gas temperature e.g. from 305 K to 295 K. The gas then passes the first heat exchanger for the second time, which cools the gas from e.g. 295 K to e.g. 285 K. The gas has thus been cooled to a temperature which is below the reference temperature of the lithographic apparatus and is below the temperature of the water. The heat exchangers may comprise the cooling apparatus 314, and may be used to provide cooled gas to the pipe 310 (see FIGS. 4 and 5).

The diameter of the constriction may be tuned to provide high flow velocities. A temperature drop of around 9 K may be achievable when the velocity is the speed of sound. A flat tube with length 10 cm and cross-section 5×0.5 mm, and an upstream pressure of 180 mbar and a downstream pressure of 20 mbar will achieve about 1000 m/s gas velocity in the last centimeter and roughly 300 m/s in the first nine centimeters, at a hydrogen flow rate of 100 mbar l/s (which may for example be the flow rate of hydrogen delivered to the opening of the lithographic apparatus).

In an embodiment, instead of using a heat exchanger with a constriction to directly cool the gas delivered to the opening 301, a heat exchanger with a constriction may be used to indirectly cool the gas delivered to the opening. For example, a heat exchanger may be in thermal contact with a pipe having a constriction and may be in thermal contact with a separate pipe which is used to carry gas for delivery to the opening 301. A potential advantage of this approach is that it provides freedom to pass a different gas through the constriction. A temperature drop of around 9 K may be achievable when the gas velocity is the speed of sound. The different gas may for example be nitrogen or some other gas which will provide a greater temperature drop for a given flow velocity than hydrogen. A potential advantage which arises from using nitrogen is that it is safer to use than hydrogen because it is not flammable. The non-flammable nature of nitrogen may allow it to be used at higher pressures than hydrogen. Other gases may be used.

If a gas cooling apparatus is used to cool the cooling apparatus 314, the degree of cooling of the cooling apparatus may be adjusted by adjusting the flow of gas through the gas cooling apparatus. Additionally or alternatively, the degree of cooling may be adjusted by controlling the size of the constriction.

In an embodiment, one or more locations at which the gas passes from a location with a small cross-sectional area to a location with a large cross-sectional area may be provided with rounded corners rather than square corners. For example, referring to FIG. 4, rounded corners may be provided at the location at which the annular slit 306 opens into the opening 301. In a further example, rounded corners may be provided at the location where the pipe 310 connects to the annular chamber 308. The rounded corners may provide a more gradual transition of cross-sectional area than square corners, thereby reducing undesired thermal effects which may arise at those corners due to rapid pressure drops (the rounded corners may make the pressure drop more gradual). This may reduce the transfer of heat to the gas. A rounded corner may simply be a rounded bevelling of a square corner, or may be a gradual curve. The gradual curve may be extensive, for example being such that the diameter of the pipe 310 increases gradually to a diameter which corresponds with (or is similar to) a diameter of the annular chamber 308.

In an embodiment, a baffle (not shown) may be provided in the annular chamber 308, the baffle acting to promote circulation of the gas within the annular chamber and thereby equalize pressure within the annular chamber. Heat may flow from the gas to the baffle. The baffle may be actively cooled, for example using a water-based cooling system. Alternatively, the baffle may be passively cooled, for example by establishing a thermal contact between the baffle and a heat sink. The baffle may thus cool the gas, thereby reducing the amount of heating of the substrate which may be caused by the gas (or reducing the temperature difference needed at the cooling apparatus 314 to achieve a desired gas temperature at the opening 301).

Described embodiments of the invention have referred to delivering gas to the opening 301 at the reference temperature of the lithographic apparatus. Thermal modelling has found that where this is done there may be a small degree of net heating of the substrate W by the gas. For this reason, the gas may be delivered to the opening 301 at a temperature which is below the reference temperature of the lithographic apparatus (e.g. less than 0.5 K below the reference temperature, or less than 0.25 K below the reference temperature).

In an embodiment, the temperature of the opening defining wall 302 may be monitored during operation of the lithographic apparatus In an embodiment, the temperature of the opening defining wall 302 may be adjusted using a thermal controller. An example of a thermal controller which may be used to adjust the temperature of the opening defining wall 302 is shown schematically in FIG. 10. The thermal controller comprises a heat pipe 400 which is in thermal contact with the opening defining wall 302 at one end and which is connected to a temperature control apparatus 402 at an opposite end. The temperature control apparatus 402 may for example be a cooling apparatus. For simplicity some parts of the lithographic apparatus which are shown in other Figures are not shown in FIG. 10.

Figure 10:
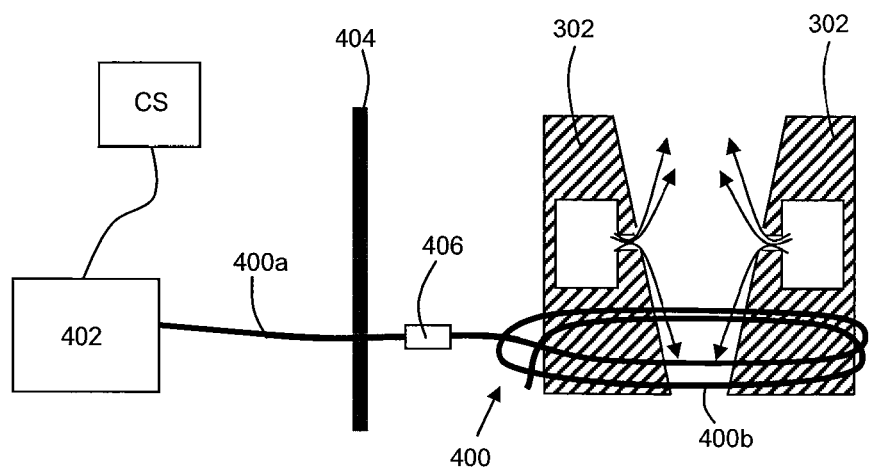
FIG. 10 schematically depicts part of the projection system and associated components which may form part of an embodiment of the invention.

The heat pipe 400 may for example be wrapped a plurality of times around the exterior of the opening defining wall 302 (as schematically represented in FIG. 10). The heat pipe 400 may be secured to the opening defining wall 302 by glueing the heat pipe to the opening defining wall. The heat pipe 400 may be secured to the opening defining wall 302 by providing flanges or other structures projecting from the opening defining wall which define recesses into which the heat pipe may be pressed. The pipe may be secured to the opening defining wall 302 by providing recesses in the opening defining wall into which the heat pipe 400 may be pressed. Although the heat pipe is shown as being wrapped a plurality of times around the exterior of the opening defining wall 302, it is not essential that this is the case. The heat pipe may be connected in any suitable manner to the opening defining wall 302.

The heat pipe 400 may be a single entity or may comprise a plurality of heat pipe pieces which are connected together using one or more connectors to form a heat pipe. For example, in FIG. 10 the heat pipe is formed from two heat pipe pieces 400a, 400b which are connected by a connector 406. Providing the heat pipe as a plurality of pieces which may be connected together may facilitate easier installation of the heat pipe in the lithographic apparatus.

The temperature control apparatus 402 may for example be a Peltier cooler, heat exchanger, or any other suitable heating or cooling apparatus. The temperature control apparatus 402 may be controlled by a control system CS. The control system CS may be the same control system that is used to control the temperature of the gas delivered to the opening 301 (see FIG. 4).

The temperature control apparatus 402 may be located outside of a vacuum enclosure of the lithographic apparatus. This is illustrated schematically in FIG. 10 by showing the temperature control apparatus 402 on an opposite side of a vacuum system wall 404 from the opening defining wall 400. Various advantages may arise from providing the temperature control apparatus 402 outside of the vacuum enclosure. These include greater available space, easier servicing, and the absence of the requirement to use vacuum compatible components. A vacuum feed-through unit may be used to facilitate passage of the heat pipe 400 through the vacuum system wall 404. Suitable vacuum feed-three units are disclosed in the prior art.

The term 'heat pipe' may be interpreted as meaning a heat-transfer device that uses both thermal conductivity and phase transition to transfer heat. The heat pipe 400 may for example comprise a hollow metal pipe within which a transport medium is provided. The heat pipe may include a cavity within which gas may flow and may optionally include a wick structure along which liquid may flow. The hollow metal pipe may for example be formed from aluminium. The transport medium used within the heat pipe 400 may for example be ammonia ($NH_3$), which is suitable for use in heat pipes over a range of operating temperatures of around −40° C. to around 50° C. Any other suitable transport medium may be used within the heat pipe 400. The heat pipe 400 may have a very large heat transport capacity (compared with the heat transport capacity of a solid piece of metal for example). It is this very large heat transport capacity which allows the temperature control apparatus 402 to be located some distance away from the opening defining wall 302.

In an embodiment, the temperature control apparatus 402 may be located within a vacuum enclosure of the lithographic apparatus.

Heat losses from exposed surfaces of the heat pipe 400 within the vacuum enclosure of the lithographic apparatus may be low. If desired, the heat losses may be reduced by providing appropriate shielding of the heat pipe. The shielding may for example comprise radiation shielding and/or molecular conduction shielding apparatus.

In the event that the heat pipe 400 extends outside of the vacuum enclosure of the lithographic apparatus, heat losses from exposed surfaces of the heat pipe 400 may be higher. Insulation may be used to reduce heat losses from the exposed surfaces of the heat pipe 400.

Due to the length of the heat pipe 400, in an embodiment a pump (not illustrated) may be used to assist the flow of fluid through the heat pipe. In an embodiment, the heat pipe may be sloped in order that gravity may be used to encourage the flow of liquid along the heat pipe.

Adjusting the temperature of the opening defining wall 302 directly may allow the temperature of gas delivered to the opening 301 to be adjusted. This adjustment may be made instead of or in addition to cooling of the gas by the cooling apparatus 314.

Although the opening defining wall 302 is represented as a single entity in FIG. 4, in an embodiment the opening defining wall may be provided as two separate entities. These may comprise an upper opening defining wall which extends down as far as the top of the annular slit 306, and a lower opening defining wall which extends upwards as far at the bottom of the annular slit. Where upper and lower opening defining walls are provided, the opening defining walls may be thermally separated from each other (or substantially thermally separated from one another). The upper and lower opening defining walls may for example be respectively fixed above and below a plate which supports the opening defining walls. The plate may be provided with an opening which is commensurate in size with the opening 301. The plate may be formed from aluminium or some other metal. In an embodiment, a ceramic ring may be provided in the opening in the plate, and the upper and lower opening defining walls may be attached to the ceramic ring such that they are not in direct contact with the plate.

In an embodiment, the temperature of the lower opening defining wall may differ from the temperature of the upper opening defining wall during operation of the lithographic apparatus, and these temperatures may in turn differ from the temperature of a wall of the pipe 310 or the temperature within the annular chamber 308. A thermal shunt or heat pipe may be provided, for example between the lower opening defining wall and part of a wall of the pipe 310, the thermal shunt or heat pipe acting to cool the lower opening defining wall and thereby reduce heating of the gas which may be caused by the lower opening defining wall. Thermal shunts or heat pipes may be provided between other parts of the apparatus. A thermal shunt may for example comprise an aluminium beam, for example with a cross-section to length ratio of around 3 m (e.g. 1.2 cm² cross-section and 5 cm long).

The control system CS may take into account any of the parameters mentioned above, for example including the temperature of the cooling apparatus 314, the temperature of the opening defining wall 302, the temperature of the substrate table WT, the temperature of the substrate W, the flow rate of the gas, the heat capacity of the gas, and the fraction of the gas which travels down and out of the opening 301.

Although the connection between the opening defining wall 302 and the projection system walls 312, 313 is vertical in the Figures, the connection may have any shape. The exterior of the opening defining wall 302 may for example have any shape.

Illustrated embodiments of the invention include the opening defining wall 302, which has a sloping inner surface 304 that is substantially matched to the shape of the EUV radiation beam 28 (see FIG. 8). This shape may provide the advantage that it provides good contamination suppression without blocking the EUV radiation beam. However, it is not essential that embodiments of the invention include a sloping wall, and embodiments of the invention may have a wall which has some other shape.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
a substrate table constructed to hold a substrate;
a projection system configured to project a patterned radiation beam out of the projection system through an opening defined by an opening defining wall connected to walls of a lower portion of the projection system and onto a target portion of the substrate;
a conduit having an outlet in the opening, the conduit being configured to deliver a gas to the opening; and
a cooling apparatus controlled by a control system, the cooling apparatus configured to cool the gas such that gas that travels from the opening to the substrate has a predetermined temperature when the gas is incident upon the substrate.

2. The lithographic apparatus of claim 1, wherein the predetermined temperature is a reference temperature of the lithographic apparatus.

3. The lithographic apparatus of claim 1, wherein the predetermined temperature is below a reference temperature of the lithographic apparatus.

4. The lithographic apparatus of claim 2, wherein the cooling apparatus is configured to cool the temperature of the gas to at least 5K below the reference temperature of the lithographic apparatus.

5. The lithographic apparatus of claim 1, wherein a gap and/or insulating material is provided between the opening defining wall and the walls of the projection system.

6. The lithographic apparatus of claim 5, wherein thermal conductance between the opening defining wall and adjacent parts of the lithographic apparatus is less than 0.5 W/K.

7. The lithographic apparatus of claim 1, wherein the conduit comprises a pipe, and wherein a gap and/or insulating material is provided between the pipe and walls of the projection system.

8. The lithographic apparatus of claim 1, further comprising a metrology apparatus configured to measure overlay of a pattern projected onto the substrate by the lithographic apparatus, wherein the control system is configured to determine an adjustment of the predetermined temperature of the gas based upon an output from the metrology apparatus.

9. The lithographic apparatus of claim 1, wherein the outlet is an annular slit.

10. The lithographic apparatus of claim 9, wherein corners of the annular slit are rounded.

11. The lithographic apparatus of claim 1, wherein the conduit comprises an annular chamber that extends around the opening.

12. The lithographic apparatus of claim 1, further comprising a heat pipe connected to a wall of the opening at one end and connected to a temperature control apparatus at an opposite end.

13. The lithographic apparatus of claim 1, further comprising a measurement apparatus configured to measure infrared radiation reflectivity of the substrate.

14. The lithographic apparatus of claim 13, wherein the control system is configured to determine an adjustment of the predetermined gas temperature to take into account the measured infrared reflectivity of the substrate.

15. The lithographic apparatus of claim 2, wherein the reference temperature of the lithographic apparatus is between 20° C. and 23° C.

16. A device manufacturing method comprising:
projecting a patterned beam of radiation out of the projection system through an opening defined by an opening defining wall connected to walls of a lower portion of a projection system onto a substrate;
delivering a gas to the opening in the projection system via a conduit that has an outlet in the opening; and
cooling the gas using a cooling apparatus such that the gas has a predetermined temperature when the gas is incident upon the substrate after passing through the opening.

17. The device manufacturing method of claim 16, wherein the predetermined temperature is a reference temperature of the lithographic apparatus.

18. The device manufacturing method of claim 17, wherein the predetermined temperature is below a reference temperature of the lithographic apparatus.

19. The device manufacturing method of claim 16, wherein the thermal conductance between the opening defining wall and other parts of the lithographic apparatus is less than half of a heat capacity per unit time of the gas.

* * * * *